United States Patent
Janik et al.

(10) Patent No.: US 7,109,735 B1
(45) Date of Patent: Sep. 19, 2006

(54) METHOD FOR MEASURING GATE DIELECTRIC PROPERTIES FOR THREE DIMENSIONAL TRANSISTORS

(75) Inventors: Gary R. Janik, Palo Alto, CA (US); Eric Bouche, Pleasanton, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/196,589

(22) Filed: Aug. 2, 2005

(51) Int. Cl.
*G01R 31/02* (2006.01)

(52) U.S. Cl. ...................................... 324/763; 324/750
(58) Field of Classification Search ................ 324/750, 324/763, 765
See application file for complete search history.

(56) References Cited

U.S. PATENT DOCUMENTS

| 6,121,783 | A  | 9/2000 | Horner et al. |
| 6,191,605 | B1 | 2/2001 | Miller et al. |
| 6,202,029 | B1 | 3/2001 | Verkuil et al. |
| 6,522,158 | B1 * | 2/2003 | Fung et al. .................. 324/765 |
| 6,680,621 | B1 * | 1/2004 | Savtchouk et al. ......... 324/765 |
| 6,915,232 | B1 * | 7/2005 | Kitajima et al. ............ 702/171 |

* cited by examiner

*Primary Examiner*—Vinh Nguyen
*Assistant Examiner*—Arleen M. Vazquez
(74) *Attorney, Agent, or Firm*—Bever, Hoffman & Harms, LLP; Jeanette S. Harms (57) ABSTRACT

A method for measuring three-dimensional gate dielectric structures can involve forming test patterns that cover a range of dimensional values for the fins on which the gate dielectric structures are formed. Then, by measuring the gate dielectric properties and then correlating those measurements with the underlying fin dimensions, a relationship between fin dimension(s) and gate dielectric properties can be determined. That relationship can then be applied to actual device structures to interpolate/extrapolate gate dielectric property values based on the fin dimensions in the actual device.

16 Claims, 5 Drawing Sheets

METHOD FOR MEASURING GATE DIELECTRIC PROPERTIES FOR THREE DIMENSIONAL TRANSISTORS

FIELD OF THE INVENTION

The invention relates to the field of semiconductor metrology, and in particular to a system and method for characterizing gate dielectrics in vertically-oriented devices.

RELATED ART

Traditionally, semiconductor devices such as metal-oxide-semiconductor (MOS) transistors have been formed as essentially planar devices (sometimes referred to as "bulk" devices). Specifically, the gate dielectric and gate elements in such devices have been flat structures formed on the surface of a silicon wafer. However, in modern semiconductor devices, the need to achieve higher device performance in reduced die areas has led to the development of device designs that make greater use of the vertical dimension (i.e., "three dimensional" transistors). For example, a "tri-gate" transistor can be formed by etching parallel trenches into a silicon wafer, thereby creating a "fin" of silicon between the trenches. A gate dielectric layer and a gate electrode layer can then be formed that wraps over the surface of the fin, thereby creating a gate and defining a channel region for the transistor. Because the gate can apply an electric field to three surfaces of the channel region, control over current flow through the fin can be enhanced over similarly sized bulk transistors.

Unfortunately, this trend towards vertical structures within increasingly miniaturized devices can significantly complicate measurements performed on those devices. For example, gate dielectric properties (e.g., thickness, leakage, charge trap density) have a significant effect on device performance. However, gate dielectrics in modern transistors are so thin that direct measurements are extremely difficult. Therefore, various indirect metrology techniques for gate dielectrics have been developed. One of the most effective techniques is corona-oxide-semiconductor (COS) metrology, such as performed by the Quantox™ tool produced by KLA-Tencor, Inc.

COS metrology involves the deposition of a corona charge (i.e., a predetermined quantity of charge) over the gate dielectric of a MOS transistor. The corona and the silicon substrate form a parallel plate capacitor (surrounding the gate dielectric). Therefore, in response to the corona charge, a surface potential (voltage) is generated that is determined by the capacitance of the gate dielectric. By taking surface voltage measurements for a range of charge values (typically using a vibrating Kelvin probe to enable non-contact measurements), a charge-voltage curve can be generated. From the charge-voltage curve, gate dielectric characteristics can be determined (e.g., capacitance, thickness, leakage, and charge trap density, among others).

Unfortunately, the constantly decreasing dimensions of advanced semiconductor devices can limit the applicability of the COS technique. Specifically, the gate dielectrics in many advanced devices are too small to reliably accept an accurate corona charge. Furthermore, properly applying the corona charge to vertical surfaces can be difficult, which can render the technique unsuitable for three-dimensional transistors.

Accordingly, it is desirable to provide a system and method for measuring modern gate dielectrics in a variety of configurations.

SUMMARY OF THE INVENTION

Conventional charge-based measurement tools and techniques (e.g., charge-oxide-semiconductor (COS) metrology, mercury probe C-V curve measurement, direct contact probe metrology, and microwave probe metrology) are limited in their ability to perform measurements on the small gate dielectrics found in modern semiconductor devices. By performing charge-based measurements on appropriately designed test patterns (i.e., structures representative of actual device structures but formed outside of functional IC regions), gate dielectrics that are too small for direct measurements can be accurately characterized.

In one embodiment, a wafer can include a plurality of test patterns, each test pattern having fins formed on the semiconductor and a dielectric layer formed over the fins. Each test pattern includes a sufficient number of fins that the test pattern provides a large enough target for accurate charge deposition during charge-based metrology. Within a particular test pattern, the fins have the same height, width, and inter-fin spacing. However, fins from different test patterns exhibit a difference in at least one of height, width, and inter-fin spacing. Therefore, the charge-based metrology will result in different charge-voltage curves, and hence, different measurement values for the dielectric layers in each of the test patterns. By correlating these measurement value variations with the dimensional differences for the fins in each of the test patterns, the effect(s) of fin dimension(s) on dielectric properties can be determined. Those dimensional effects can then be used to generate dielectric property values for gate dielectrics associated with actual devices on the wafer, even if those gate dielectrics are too small for direct charge-based measurements.

In one embodiment, a metrology system can include charge deposition and voltage measurement elements, logic for determining dielectric layer property values from the voltage measurements, logic for generating fin dimensional effects on dielectric characteristics by correlating the dielectric layer property values with fin dimension variations, and logic for generating dielectric layer property values for an actual device gate dielectric by applying the fin dimensional effects to the dimensions of the fin(s) underlying the gate dielectric. In one embodiment, the charge deposition element can be a corona discharge electrode. In another element, the voltage measurement element can be one of a vibrating Kelvin probe, a mercury probe, a direct contact probe, and a microwave probe.

In another embodiment a test pattern for charge-based metrology can include one or more fins formed in a non-functional region of a semiconductor substrate, a dielectric layer formed over the one or more fins, and conductive layers formed on portions of the dielectric layer (e.g., on only the vertical surfaces of the dielectric layer). The conductive layers are electrically connected together and are also electrically connected to a large charging pad. The charging pad is large enough to receive an accurate quantity of charge, which is then distributed to the localized regions of the test pattern by the conductive layers. The resulting surface voltage can then be used to determine the properties of the dielectric layer at the locations covered by the conductive layers.

The invention will be more fully understood in view of the figures and the following detailed description.

DETAILED DESCRIPTION

Conventional charge-based measurement tools and techniques (e.g., charge-oxide-semiconductor (COS) metrology, mercury probe C-V curve measurement, direct contact probe metrology, and microwave probe metrology) are limited in their ability to perform measurements on the small gate dielectrics found in modern semiconductor devices. By performing charge-based measurements on appropriately designed test patterns (i.e., structures representative of actual device structures but formed outside of functional IC regions), gate dielectrics that are too small for direct measurements can be accurately characterized.

Figure 1A:
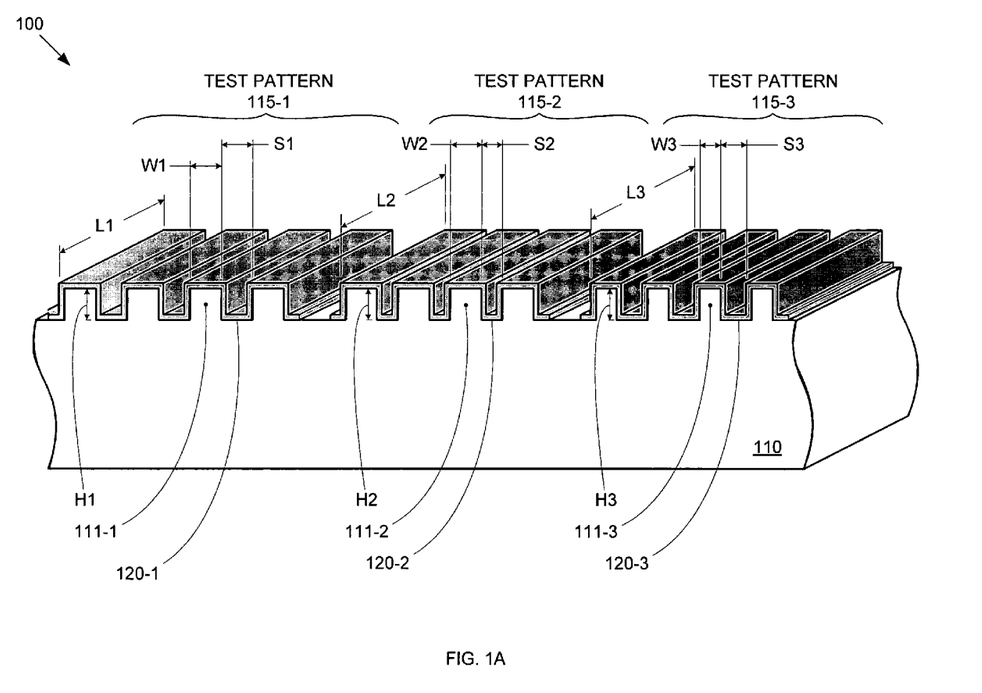
FIGS. 1A and 1B are cross-sectional diagrams of a test pattern for enabling targeted gate dielectric characterization.

FIG. 1A shows a set of exemplary test patterns 115-1, 115-2, and 115-3 for use in charge-based measurement techniques, such as COS. Test pattern 115-1 includes a gate dielectric layer 120-1 formed over four fins 111-1 extending from the surface of a substrate 110 (e.g., a semiconductor wafer). Test pattern 115-2 includes a gate dielectric layer 120-2 formed over four fins 111-2 extending from substrate 110. Test pattern 115-3 includes a gate dielectric layer 120-3 formed over four fins 111-3 extending from substrate 110. Each of fins 111-1 has a height H1, a length L1, a width W1, and an inter-fin spacing S1 (i.e., the spacing between adjacent fins is S1). Each of fins 111-2 has a height H2, a length L2, a width W2, and an inter-fin spacing S2. Each of fins 111-3 has a height H3, a length L3, a width W3, and an inter-fin spacing S3. Each of test patterns 115-1 through 115-3 is sized to fit within a scribe line on substrate 110 (e.g., lengths L1, L2, and L3 are all 50 μm or less).

Each of fins 111-1 through 111-3 in test patterns 115-1 through 115-3, respectively, has height, width, and spacing dimensions that are on the order of (though not necessarily exactly equal to) devices in functional regions of substrate 110. However, test patterns 115-1 through 115-3 are formed in non-functional regions of substrate 110 (e.g., scribe lines) and therefore need not precisely mimic functional device configurations. Therefore, test structures 115-1 through 115-3 are formed from quantities of fins that allow test structures 115-1 through 115-3 to present larger targets for charge deposition (e.g., corona charge application) than would be provided by actual device structures. Therefore, whereas a corona discharge electrode would be unable to accurately deposit a specific corona charge on, for example, a gate dielectric for a tri-gate transistor formed on a single one of fins 111-1, that same corona discharge electrode would be able to deposit the desired corona charge on gate dielectric layer 120-1, which is formed over four fins 111-1. Therefore, various corona charges can be applied to each of gate dielectric layers 120-1 through 120-3, and the resulting surface voltages can be used to generate charge-voltage curves for each gate dielectric layer 120-1 through 120-3.

By making test patterns 115-1 through 115-3 dimensionally different (i.e., by selecting different height, width, and/or spacing dimensions for fins 111-1 through 111-3 in test patterns 115-1 through 115-3, respectively), a given range of corona charge quantities will generate different charge-voltage curves for each of gate dielectric layers 120-1 through 120-3. The different charge-voltage curves can then be analyzed in light of the localized dimensional changes in test patterns 115-1 through 115-3 (e.g., changes in fin height, fin width, and inter-fin spacing) to correlate fin dimensional changes with changes in gate dielectric properties.

For example, fins 111-1, 111-2, and 111-3 in test patterns 115-1, 115-2, and 115-3, respectively, could have the same fin widths (i.e., W1=W2=W3) and the same inter-fin spacings (i.e., S1=S2=S3), but could have different fin heights (i.e., H1≠H2≠H3). Consequently, any difference in charge-voltage curves generated from test patterns 115-1 through 115-3 (generated using the same charge levels) could be correlated to the fin height variations. This correlation data defines the relationship between fin height and gate dielectric properties (e.g., thickness, capacitance, leakage, and charge trap density, among others) for vertical regions of gate dielectric layers. Using this set of "height effects", measurement values for the gate dielectric properties of the vertical portions of gate dielectric layers in functional devices on substrate 110 can be determined (for gate dielectric layers formed using the same processes used to form gate dielectric layers 120-1 through 120-3 in test patterns 115-1 through 115-3, respectively). For example, the set of height effects can be used to interpolate or extrapolate the dielectric characteristics for a gate dielectric formed over actual device fins (i.e., fins formed in a functional region of substrate 110), based on the height of those actual device fins.

By providing test patterns having varying fin spacing and/or fin width values, similar sets of "spacing effects" (for gate dielectric layer portions between fins) and "width effects" (for gate dielectric layer portions on the top surface of fins), respectively, can be determined. In this manner, COS tool limitations (i.e., the inability to apply charge to the gate dielectric of a single device) can be overcome through the use of test patterns (e.g., 115-1 through 115-3) providing much larger charge targets. Note that while three different test patterns 115 are depicted for exemplary purposes, the technique can be applied using any number of test patterns 115 greater than one (i.e., at least two test patterns are required to determine a set of height, spacing, or width effects).

Note that most charge-based metrology techniques (such as COS) rely on a relatively evenly distributed corona charge across the gate dielectric. However, due to the comparatively large size and complex topography of gate dielectric layers 120, the deposited corona charge on each dielectric layer 120 may exhibit localized maxima and minima that can detrimentally affect the subsequent surface voltage measurements. Therefore, according to another embodiment, each test structure 115 can include a gate electrode layers (i.e., layers formed during the gate electrode process steps for functional devices on the same wafer) to ensure even charge distribution over gate dielectric layers 120.

Figure 1B:
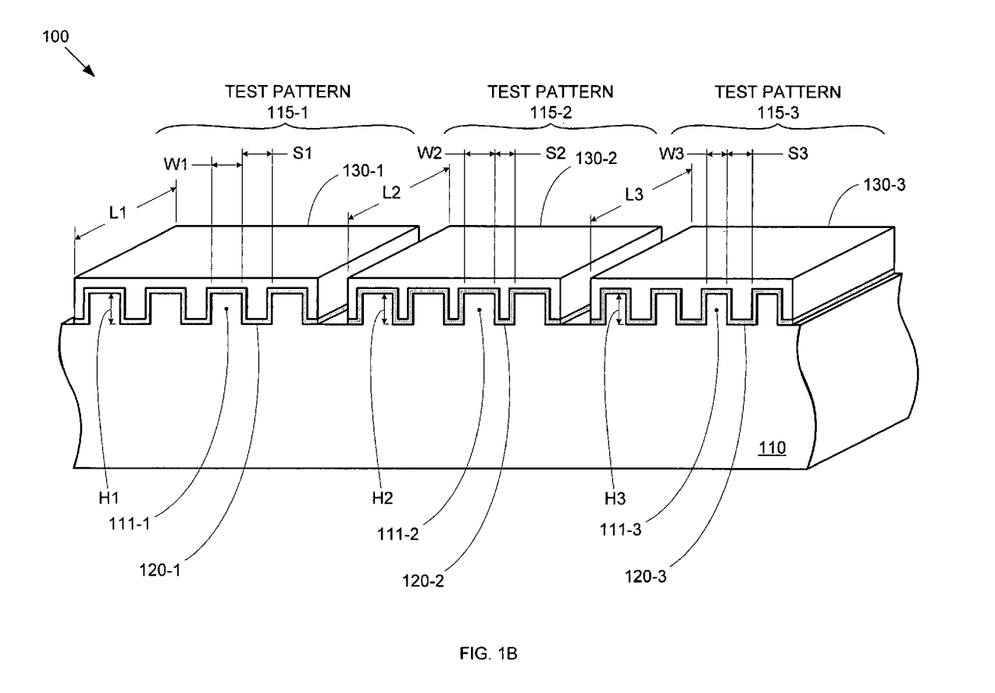

For example, FIG. 1B depicts exemplary gate layers 130-1, 130-2, and 130-3 formed over test patterns 115-1, 115-2, and 115-3 (described with respect to FIG. 1A), respectively. Gate layers 130-1 through 130-3 can comprise any material used to form a gate in a MOS transistor (e.g., doped polysilicon, silicide, or even metal) and can be formed using the same processes used to form the gates of actual transistors on substrate 110. Conductive gate layers 130-1 through 130-3 ensure that the corona charge deposited onto test patterns 115-1 through 115-3, respectively, during charge-based metrology will be evenly distributed over gate dielectric layers 120-1 through 120-3, respectively, and that the surface of the gate dielectric will have a single, uniform electrical potential. Subsequent measurements and analyses can then be performed in a manner substantially similar to that described with respect to FIG. 1A.

Figure 2:
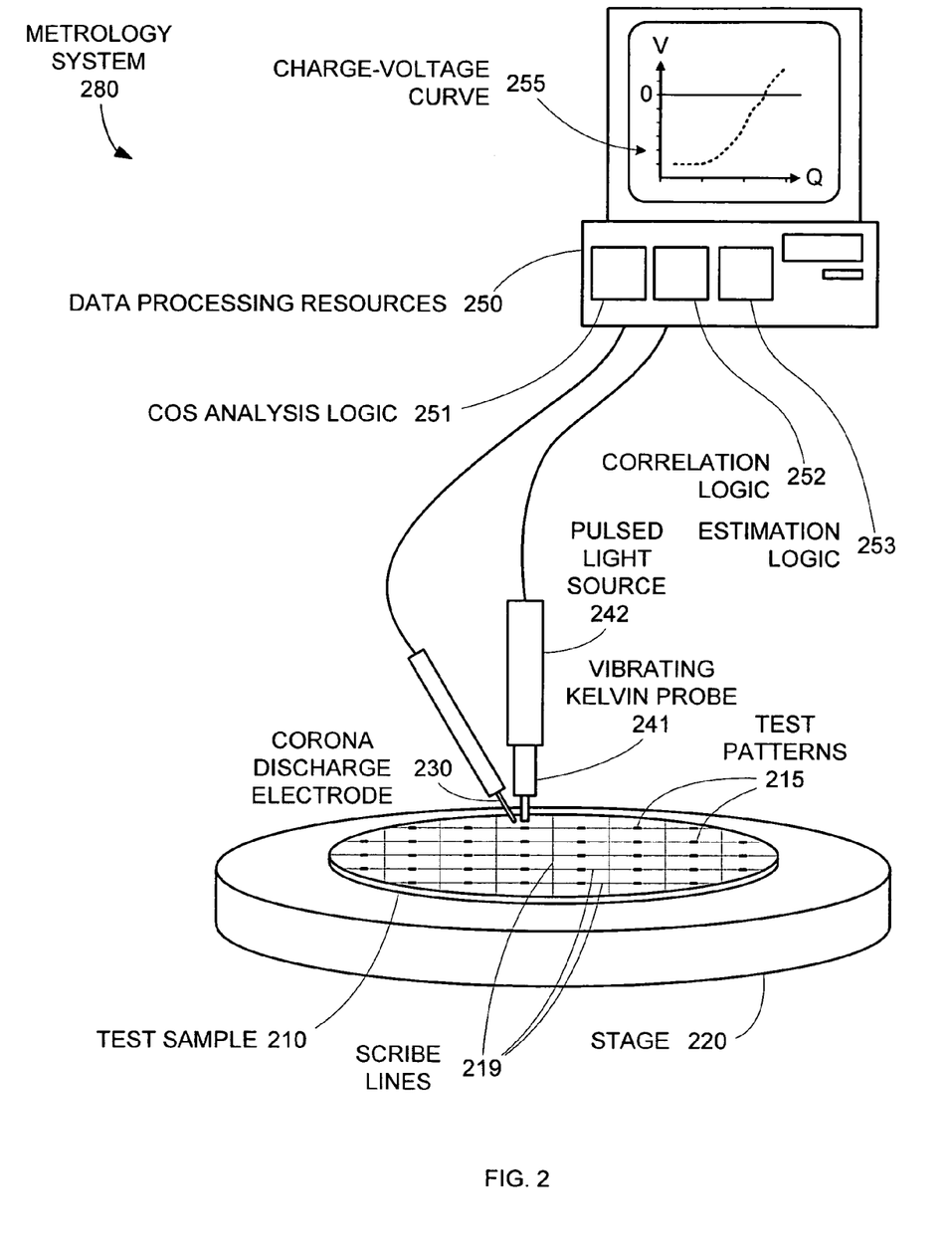
FIG. 2 is a diagram of a metrology system for performing charge-based measurements using the test pattern of FIGS. 1A and 1B.

FIG. 2 shows an exemplary charge-based metrology system 280 that includes a stage 220, a corona discharge electrode 230, a vibrating Kelvin probe 241, an optional pulsed light source 242, and data processing resources 250. Metrology system 280 therefore includes the charge deposition and voltage measurement elements of a typical COS metrology system. Note, however, that according to various other embodiments, corona discharge electrode 230 and vibrating Kelvin probe 241/pulsed light source 242 could be replaced with any charge application mechanism and surface voltage measurement mechanism, respectively. Stage 220 supports a test sample 210 that includes a plurality of test patterns 215 formed in scribe lines 219 of test sample 210. Test patterns 215 are substantially similar to test patterns 115 described with respect to FIGS. 1A and 1B, and can include a variety of fin configurations covered by gate dielectric layers. In one embodiment, each test pattern 215 includes a conductive gate layer formed over each of the gate dielectric layers to facilitate even charge distribution and uniform potential over the gate dielectric layers (as described with respect to FIG. 1B).

To perform a COS measurement operation, corona discharge electrode 230 applies a specific corona charge to each of a selected set of test patterns 215. The resulting surface voltages on each of the set of test patterns 215 are then measured by vibrating Kelvin probe 240 and (and optional pulsed light source 250, if present) and provided to data processing resources 250. This process is repeated over a range of corona charge values to allow COS analysis logic 251 in data processing resources 250 to generate charge-voltage curves for each of the set of test patterns 215 and provide dielectric property values for each gate dielectric layer in the set of test patterns 215 from those charge-voltage curves. An exemplary charge-voltage curve 255 is depicted on data processing resources 250, showing how the various points defined by each charge Q and associated surface voltage V form a charge-voltage curve that can be used to determine dielectric properties. Note that while a graphical display of charge-voltage curve 255 is shown for exemplary purposes, in various embodiments, the analysis of the measurement data can be performed without actually displaying some or all of the charge-voltage curves for the various test patterns.

As described with respect to FIG. 1A, the selected set of test patterns 215 exhibits different fin configurations (e.g., different heights, widths, and/or spacings) in each different test pattern. Therefore, each of the set of test patterns 215 will exhibit a different charge-voltage curve (for the same set of corona charge values). Using the gate dielectric characteristics generated by COS analysis logic 251 along with the known dimensional variations among the test patterns, correlation logic 252 in data processing resources 250 can extract relationships between gate dielectric properties and fin dimensions (as described with respect to FIG. 1A). Then, based on those dimensional effects (e.g., height, width, and/or spacing effects), estimation logic 253 in data processing resources 250 can interpolate or extrapolate gate dielectric properties for actual devices on test sample 210 that would otherwise be too small for direct COS measurements.

Note that in various embodiments, data processing resources 250 can comprise any computing system, such as a personal computer, a thin client running software accessed from a remote server, or embedded logic within other components of metrology system 280, among others. Likewise, data compilation logic 251, correlation logic 252, and estimation logic 253 can comprise any type of logic for performing the described functions (e.g., generation of charge-voltage curves, derivation of dimensional effects, and interpolation/extrapolation of actual device dielectric properties, respectively), such as a software program(s) or hard-coded logic (e.g., a programmable logic controller, or PLC).

Figure 3:
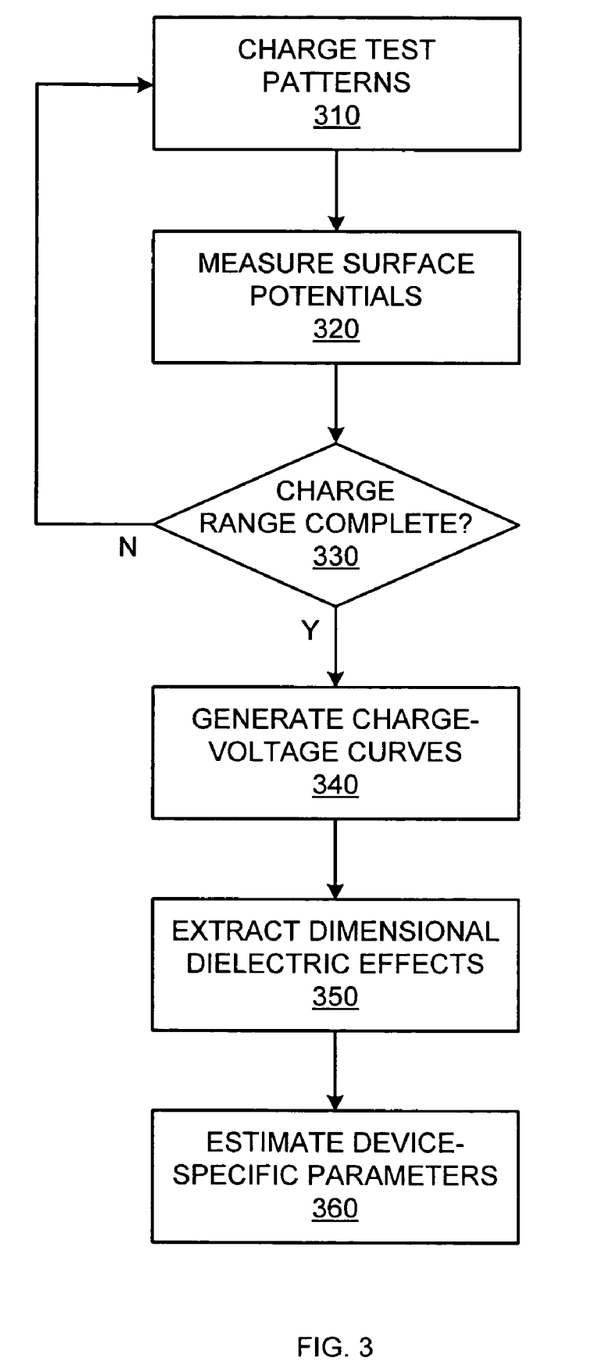
FIG. 3 is a flow diagram of a method for performing charge-based metrology using the test pattern of FIGS. 1A and 1B.

FIG. 3 shows a flow diagram of a charge-based metrology operation using multiple test patterns, such as described with respect to FIGS. 1A, 1B, and 2. In a "CHARGE TEST PATTERNS" step 310, a selected corona charge is applied to each of a group of test patterns (e.g., test patterns 115-1 through 115-3 in FIG. 1A). The resulting voltage induced on the surface of each test pattern is then measured in a "MEASURE SURFACE POTENTIALS" step 320. A "CHARGE RANGE COMPLETE?" step 330 loops the process back to step 310 to allow a range of different corona charges to be applied to the test patterns. Once surface voltage measurements have been taken for each desired corona charge value, charge-voltage curves are generated for each of the test patterns in a "GENERATE CHARGE-VOLTAGE CURVES" step 340 (as described with respect data compilation logic 251 in FIG. 2). The dielectric property values derived from those charge-voltage curves can then be analyzed in conjunction with the various fin dimensions for the test patterns to define relationships between fin dimensions and dielectric properties in an "EXTRACT DIMENSIONAL DIELECTRIC EFFECTS" step 350 (as described with respect to correlation logic 252 in FIG. 2). Finally, those fin-gate dielectric relationships (effects) can then be used to interpolate and/or extrapolate gate dielectric properties in actual (functional) devices formed on the test sample in an "EXTIMATE DEVICE-SPECIFIC PARAMETERS" step 360 (as described with respect to estimation logic 253 in FIG. 2).

Figure 4:
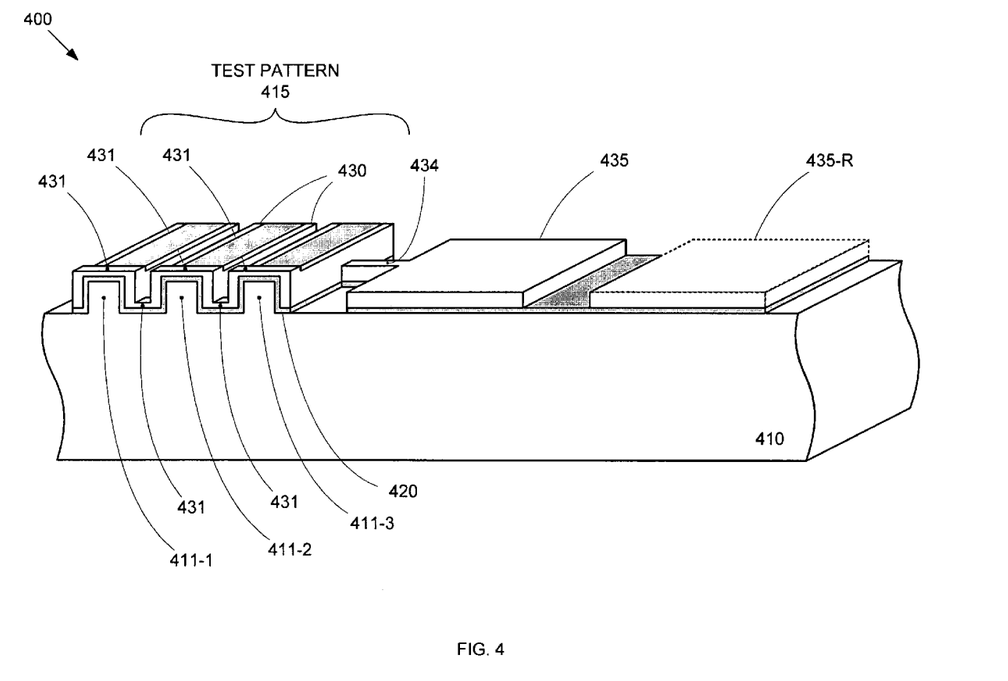
FIG. 4 is a cross-sectional diagram of a test pattern for enabling targeted gate dielectric measurements.

In another embodiment, a test pattern for charge-based metrology techniques can include charge localizing structures to enable measurements on selected portions of the test pattern. For example, FIG. 4 shows a test sample 400 that includes a test pattern 415 formed on a substrate 410. Test pattern 415 includes multiple fins 411 rising from substrate 410, a gate dielectric layer 420 formed over fins 411, conductive layers 430 formed over selected portions of gate dielectric layer 420, and conductive elements 431 connecting conductive layers 430. Test sample 400 also includes a large charging pad 435 and a conductive element 434 that electrically connects charging pad 435 to conductive layers 430. In one embodiment, test sample 400 can also include an optional charging pad replica 435-R (indicated by the dotted lines) adjacent to, and having the same dimensions as, charging pad 435.

The localized conductive layers 430 allow charge-based measurements to be made on selected portions of test pattern 415. For example, because conductive layers 430 are located only on the vertical portions of dielectric layer 420, measurement results for test pattern 415 will be representative of only those vertical portions of dielectric layer 420, thereby allowing the dielectric characteristics of those vertical regions to be measured directly. Note that the positioning of conductive layers 430 on the vertical surfaces of dielectric layer 420 is for exemplary purposes only. In various other embodiments, conductive layers 430 can be positioned on the top surfaces or inter-fin surfaces of dielectric layer 420. Furthermore, while test pattern 415 is depicted as including three fins 411 (i.e., fins 411-1, 411-2, and 411-3) for exemplary purposes, according to various other embodiments, test pattern 415 can include any number of fins 411.

By providing a large target for charge application, charging pad 435 allows desired corona charges to be easily and accurately applied to test pattern 415. Because charging pad 435 is electrically connected to conductive layers 430 (i.e., by conductive element 434), and because conductive layers 430 are all interconnected by conductive elements 431, any corona charge supplied to charging pad 435 will be distributed over conductive layers 430. By eliminating the need to deposit charge directly on test pattern 415, charging pad 435 can eliminate the problem of inadvertent charge deposition on the "open" regions of the pattern, i.e., regions in that are not covered by conductive layers 430 (e.g., the top surfaces of dielectric layer 420) and are therefore not intended to be part of the analysis area. Therefore, the large charging target provided by charging pad 435 allows only the appropriate regions of test pattern 415 to be charged, thereby allowing a single, uniform electrical potential to be provided at only the desired measurement regions.

Of course, depending on the actual plan view area occupied by test pattern 415, charging pad 435 may need to be significantly larger to provide an appropriate charging target for techniques such as COS metrology. For example, if tri-gate transistors within test sample 400 each have a single fin, test sample 415 could include a single fin 411 having the same dimensions as the fins within the tri-gate transistors. Charging pad 435 could then be sized to provide a large enough area to allow a desired corona charge to be applied via corona charge electrode. The corona charge provided at charging pad 435 would then be distributed to the desired portions of dielectric layer 420 formed over that fin 411, even if fin 411 were too small for the direct application of the corona charge by a corona discharge electrode (e.g., corona discharge electrode 230 in FIG. 2). In this manner, the localized conductive layers 430 and charging pad 435 of test pattern 415 can allow conventional charge-based metrology tools (e.g., conventional COS tools) to provide measurement results for gate dielectric structures that would normally be too small for direct measurements.

Note that during the analysis of surface voltage measurement data (e.g., charge-voltage curves) for test pattern 415, the effects of charging pad 435 must be extracted from the calculations to ensure that the analysis output is related to only the desired portions of gate dielectric layer 420 (i.e., to only those portions of gate dielectric layer 420 under conductive layers 430). Various methods for dealing with the effects of charging pad 435 will be readily apparent. In one embodiment, gate dielectric layer 420 in the region of charging pad 435 can be accurately measured (which is relatively simple due to the large planar configuration of gate dielectric layer 420 in that region), and this data, along with the known dimensions of charging pad 435 can be used to determine a capacitance at charging pad 435, which can then be subtracted from the total capacitance (i.e., the capacitance determined for the combination of test pattern 415 and charging pad 435).

In another embodiment, a capacitance value can be determined for optional charging pad replica 435-R (e.g., using the same techniques used to determine the total capacitance for the test pattern 415/charging pad 435 combination). Charging pad replica 435-R is electrically isolated from charging pad 435 (and hence, from conductive elements 430 in test pattern 415). Because charging pad replica 435-R has the same dimensions as charging pad 435 (e.g., within at least 10%), and because the characteristics of dielectric layer 420 under charging pad 435 and charging pad replica 435-R should be substantially the same (due to the relatively close proximity of charging pad 435 and charging pad replica 435-R), the capacitance of charging pad replica 435-R will closely match the capacitance of charging pad 435. Therefore, the capacitance determined for charging pad replica 435-R can be subtracted from the total capacitance determined for the combination of charging pad 435 and test pattern 415 to derive a capacitance for just those portions of gate dielectric layer 420 covered by conductive layers 430.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A metrology system comprising:
   means for supplying a set of charge quantities to each of a set of test patterns in a non-functional region of a test sample, wherein each of the set of test patterns includes a set of semiconductor fins and a conformal dielectric layer formed over the set of semiconductor fins, wherein each semiconductor fin has a fin height, a fin width, and an inter-fin spacing on the order of tri-gate transistors in a functional region of the test sample, and wherein each set of semiconductor fins is dimensionally different than each other set of semiconductor fins;
   means for measuring a surface voltage at each of the set of test patterns for each of the set of charge quantities to generate a set of charge-voltage curves for the dielectric layers;
   means for deriving a relationship between dielectric layer properties and at least one of fin height, fin width, and inter-fin spacing based on the set of charge-voltage curves and fin dimensions for the set of test patterns; and
   means for estimating dielectric properties for individual tri-gate transistors in the functional region of the test sample based on the relationship.

2. The metrology system of claim 1,
   wherein the means for supplying the set of charge quantities comprises a corona charge electrode, and
   wherein the means for measuring the surface voltage comprises a vibrating Kelvin probe.

3. The metrology system of claim 2, wherein the means for deriving the relationship comprises:
   means for analyzing the set of charge-voltage curves to determine a set of property values for the dielectric layers in the set of charge-voltage curves; and
   means for determining the relationship between the dielectric layer properties and the at least one of fin height, fin width, and inter-fin spacing based on fin dimensions for the set of semiconductor fins in each of the set of test patterns and the set of property values.

4. The metrology system of claim 1, wherein the means for measuring the surface voltage comprises at least one of a mercury probe, a direct contact probe, and a microwave probe.

5. A metrology system comprising:
- a charge application mechanism for supplying a set of charge quantities to each of a set of test patterns in a non-functional region of a test sample, wherein each of the set of test patterns includes a set of semiconductor fins and a conformal dielectric layer formed over the set of semiconductor fins, wherein each semiconductor fin has a fin height, a fin width, and an inter-fin spacing on the order of tri-gate transistors in a functional region of the test sample, and wherein each set of semiconductor fins is dimensionally different than each other set of semiconductor fins;
- a surface voltage measurement mechanism for measuring a surface voltage at each of the set of test patterns for each of the set of charge quantities to generate a set of charge-voltage curves for the dielectric layers;
- data processing resources for deriving a relationship between dielectric layer properties and at least one of fin height, fin width, and inter-fin spacing based on the set of charge-voltage curves and fin dimensions for the set of test patterns; and
- estimation logic for determining dielectric properties for individual tri-gate transistors in the functional region of the test sample based on the relationship.

6. The metrology system of claim 5,
- wherein the charge application mechanism comprises a corona charge electrode, and
- wherein the surface voltage measurement mechanism comprises a vibrating Kelvin probe.

7. The metrology system of claim 6, wherein the data processing resources comprise:
- logic for analyzing the set of charge-voltage curves to determine a set of property values for the dielectric layers in the set of charge-voltage curves; and
- logic for determining the relationship between the dielectric layer properties and the at least one of fin height, fin width, and inter-fin spacing based on fin dimensions for the set of semiconductor fins in each of the set of test patterns and the set of property values.

8. The metrology system of claim 5, wherein the surface voltage measurement mechanism comprises at least one of a mercury probe, a direct contact probe, and a microwave probe.

9. A metrology system comprising:
- a charge application mechanism for supplying a set of charge quantities to each of a set of test patterns in a non-functional region of a test sample, wherein each of the set of test patterns includes:
  - a set of semiconductor fins, wherein each semiconductor fin has a fin height, a fin width, and an inter-fin spacing on the order of tri-gate transistors in a functional region of the test sample, and wherein each set of semiconductor fins is dimensionally different than each other set of semiconductor fins;
  - a conformal dielectric layer formed over the set of semiconductor fins; and
  - a gate layer formed over the conformal dielectric layer and filling the inter-fin spacings of each test pattern;
- a surface voltage measurement mechanism for measuring a surface voltage at each of the set of test patterns for each of the set of charge quantities to generate a set of charge-voltage curves for the dielectric layers; and
- data processing resources for deriving a relationship between dielectric layer properties and at least one of fin height, fin width, and inter-fin spacing based on the set of charge-voltage curves and fin dimensions for the set of test patterns.

10. The metrology system of claim 9,
- wherein the charge application mechanism comprises a corona charge electrode, and
- wherein the surface voltage measurement mechanism comprises a vibrating Kelvin probe.

11. The metrology system of claim 9, wherein the data processing resources comprise:
- logic for analyzing the set of charge-voltage curves to determine a set of property values for the dielectric layers in the set of charge-voltage curves; and
- logic for determining the relationship between the dielectric layer properties and the at least one of fin height, fin width, and inter-fin spacing based on fin dimensions for the set of semiconductor fins in each of the set of test patterns and the set of property values.

12. The metrology system of claim 9, wherein the surface voltage measurement mechanism comprises at least one of a mercury probe, a direct contact probe, and a microwave probe.

13. A metrology system comprising:
- a charge application mechanism for supplying a set of charge quantities to each of a set of test patterns in a non-functional region of a test sample, wherein each of the set of test patterns includes:
  - a set of semiconductor fins, wherein each semiconductor fin has a fin height, a fin width, and an inter-fin spacing on the order of tri-gate transistors in a functional region of the test sample, and wherein each set of semiconductor fins is dimensionally different than each other set of semiconductor fins; and
  - a conformal dielectric layer formed over the set of semiconductor fins;
- a surface voltage measurement mechanism for measuring a surface voltage at each of the set of test patterns for each of the set of charge quantities to generate a set of charge-voltage curves for the dielectric layers; and
- data processing resources for deriving a relationship between dielectric layer properties and at least one of fin height, fin width, and inter-fin spacing based on the set of charge-voltage curves and fin dimensions for the set of test patterns.

14. The metrology system of claim 13,
- wherein the charge application mechanism comprises a corona charge electrode, and
- wherein the surface voltage measurement mechanism comprises a vibrating Kelvin probe.

15. The metrology system of claim 13, wherein the data processing resources comprise:
- logic for analyzing the set of charge-voltage curves to determine a set of property values for the dielectric layers in the set of charge-voltage curves; and
- logic for determining the relationship between the dielectric layer properties and the at least one of fin height, fin width, and inter-fin spacing based on fin dimensions for the set of semiconductor fins in each of the set of test patterns and the set of property values.

16. The metrology system of claim 13, wherein the surface voltage measurement mechanism comprises at least one of a mercury probe, a direct contact probe, and a microwave probe.

* * * * *